United States Patent [19]
Chiu et al.

[11] Patent Number: 5,990,549
[45] Date of Patent: Nov. 23, 1999

[54] THERMAL BUS BAR DESIGN FOR AN ELECTRONIC CARTRIDGE

[75] Inventors: Chia-Pin Chiu, Chandler; Imran Yusuf, Phoenix; Banerjee Koushik, Chandler; Todd Young, Chandler; Gary Solbrekken, Chandler, all of Ariz.

[73] Assignee: Intel Corporation, Santa Clara, Calif.

[21] Appl. No.: 09/019,570

[22] Filed: Feb. 6, 1998

[51] Int. Cl.⁶ .......................... H01L 23/48; H01L 23/34; H01L 23/10
[52] U.S. Cl. .......................... 257/706; 257/723; 257/678
[58] Field of Search .................. 257/706, 675, 257/685, 686, 713, 720, 723, 777, 796, 678, 718, 719, 726, 727, 724; 361/676, 688, 702, 709, 711, 679

[56] References Cited

U.S. PATENT DOCUMENTS

| | | | |
|---|---|---|---|
| 3,395,318 | 7/1968 | Laermer et al. | 257/777 |
| 4,711,804 | 12/1987 | Burgess | 257/718 |
| 5,061,990 | 10/1991 | Arakawa et al. | 257/777 |
| 5,297,006 | 3/1994 | Mizukoshi | 257/713 |
| 5,545,922 | 8/1996 | Golwalkar et al. | 257/676 |
| 5,719,436 | 2/1998 | Kuhn | 257/676 |
| 5,724,233 | 3/1998 | Honda et al. | 257/676 |

FOREIGN PATENT DOCUMENTS

| | | | |
|---|---|---|---|
| 62-141751 | 6/1987 | Japan | 257/718 |
| 2-89352 | 3/1990 | Japan | 257/718 |
| 2-232956 | 9/1990 | Japan | 257/718 |

*Primary Examiner*—Mahshid Saadat
*Assistant Examiner*—Jhihan B Clark
*Attorney, Agent, or Firm*—Blakely, Sokoloff, Taylor & Zafman LLP

[57] ABSTRACT

One embodiment of the present invention is an electronic assembly which may have a first integrated circuit package mounted to a first side of a substrate and a second integrated circuit package mounted to a second side of the substrate. A thermal plate may be thermally coupled to the first integrated circuit package. A heat sink may be mounted to the thermal plate. A thermal bus may be is thermally coupled to the second integrated circuit package and the thermal plate. The thermal bus bar allows heat to flow from the second integrated circuit package to the thermal plate and heat sink. The electronic assembly of the present invention can thus remove heat from integrated circuit packages located on both sides of a substrate with only one heat sink.

15 Claims, 2 Drawing Sheets

THERMAL BUS BAR DESIGN FOR AN ELECTRONIC CARTRIDGE

BACKGROUND OF THE INVENTION

1. Field of the Invention

The present invention relates to an electronic assembly.

2. Background Information

Integrated circuits are typically assembled into a package that is mounted to a printed circuit board. The printed circuit board may have an electrical connector which mates with a corresponding connector located on a motherboard.

The integrated circuits generate heat which must be removed from the package. The heat must be removed in a manner which maintains the junction temperatures of the integrated circuits below a threshold level.

Some printed circuit board assemblies incorporate thermal plates and heat sinks which efficiently transfer heat from the integrated circuits. The heat sink is typically mounted to a side of the printed circuit board which contains the integrated circuit(s) that generates the largest amount of heat.

Some printed circuit board assemblies contain integrated circuit packages which are mounted on both sides of the board. Effectively removing heat from both sides of the printed circuit board may require two separate heat sinks located on each side of the board. The additional heat sink will increase the weight, size and cost of the circuit board assembly. It would be desirable to provide an electronic assembly which has a single heat sink and can effectively remove heat from integrated circuit packages mounted on both sides of a printed circuit board.

SUMMARY OF THE INVENTION

One embodiment of the present invention is an electronic assembly which may have a first integrated circuit package mounted to a first side of a substrate and a second integrated circuit package mounted to a second side of the substrate. A thermal plate may be thermally coupled to the first-side integrated circuit package. A thermal bus bar may be thermally coupled to the second-side integrated circuit package and the thermal plate.

DETAILED DESCRIPTION OF THE INVENTION

One embodiment of the present invention is an electronic assembly which may have a first integrated circuit package mounted to a first side of a substrate and a second integrated circuit package mounted to a second side of the substrate. A thermal plate may be thermally coupled to the first integrated circuit package. A heat sink may be mounted to the thermal plate. A thermal bus bar may be thermally coupled to the second integrated circuit package and the thermal plate. The thermal bus bar allows heat to flow from the second integrated circuit package to the thermal plate and the heat sink. The electronic assembly of the present invention can thus remove heat from integrated circuit packages located on both sides of a substrate with only one heat sink.

Figure 1:
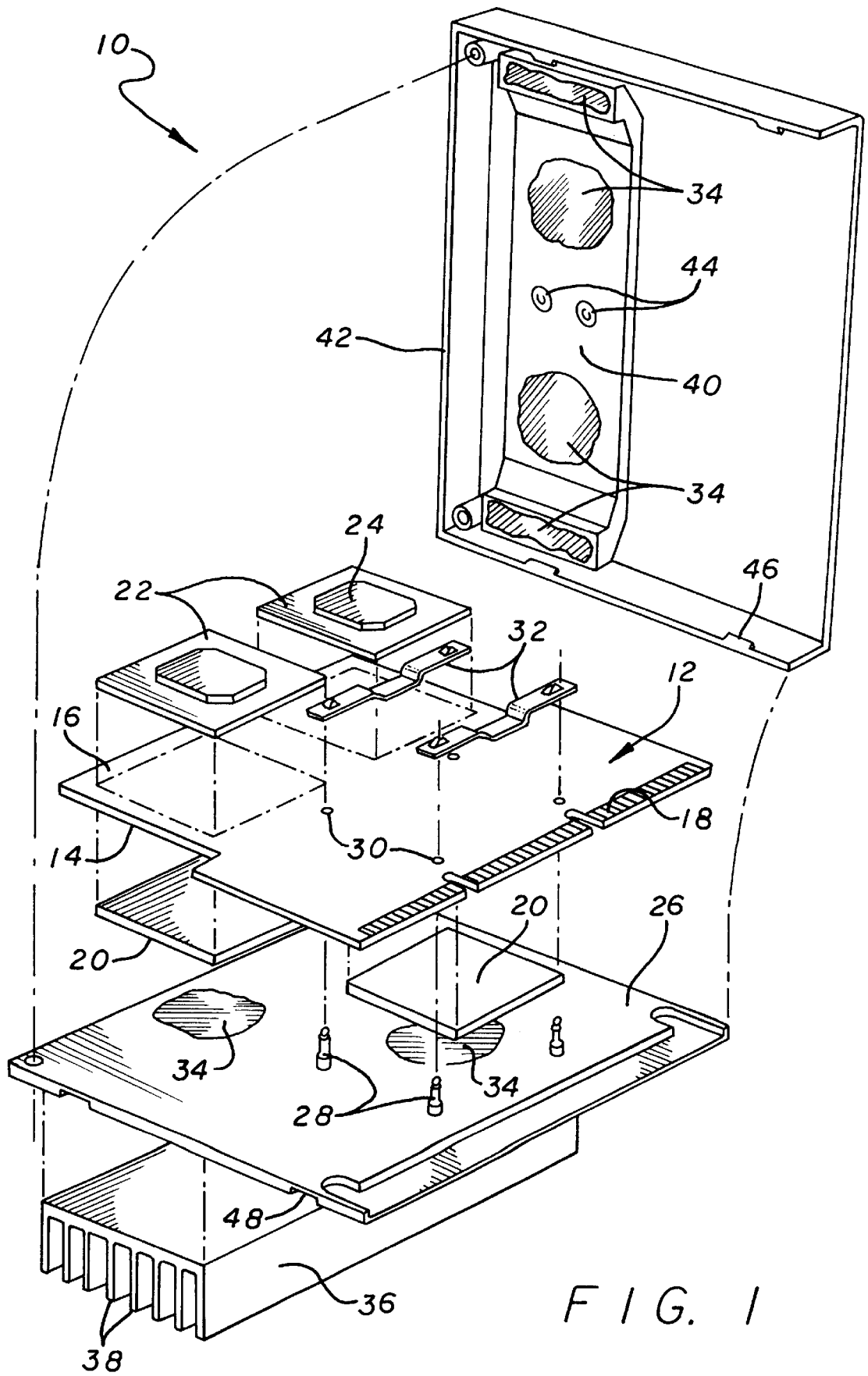
FIG. 1 is an exploded perspective view of an embodiment of an electronic assembly of the present invention.
Figure 2:
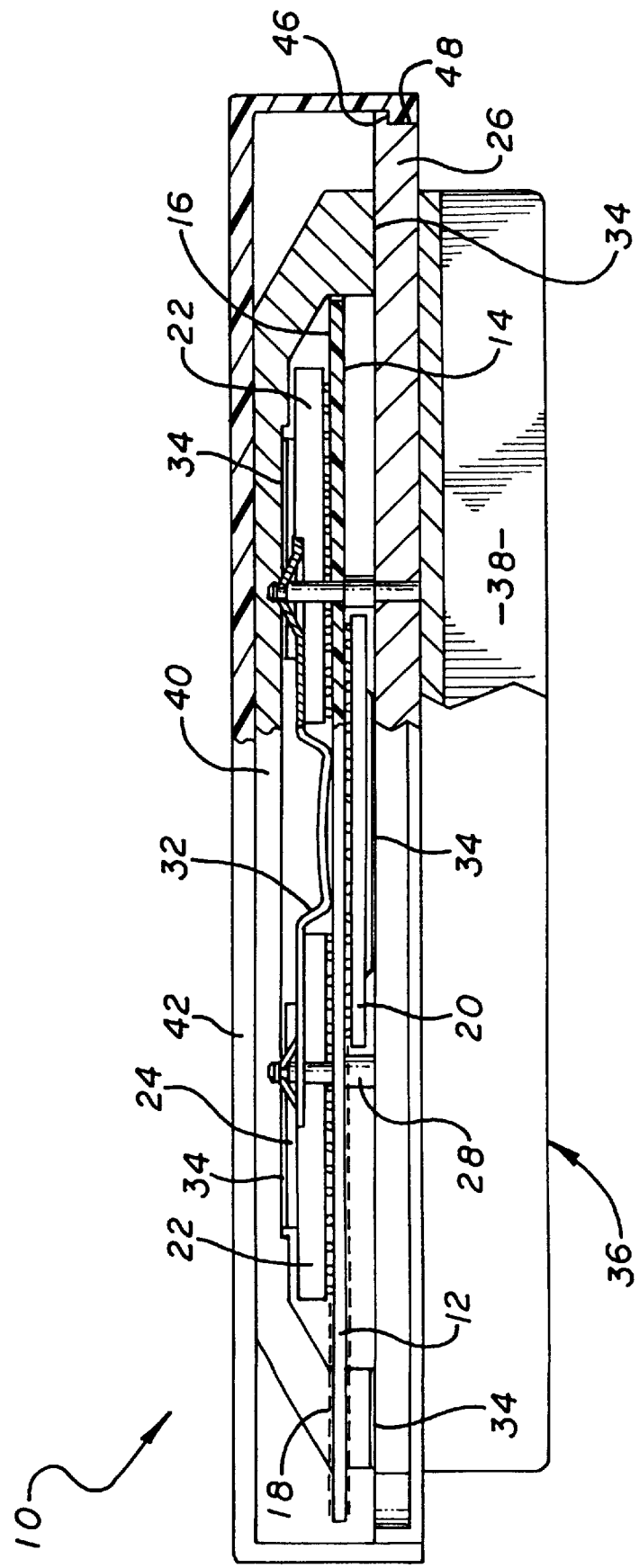
FIG. 2 is a bottom cross-sectional view of the electronic assembly shown in FIG. 1.

Referring to the drawings more particularly by reference numbers, FIGS. 1 and 2 show an embodiment of an electronic assembly 10 of the present invention. The assembly 10 may include a substrate 12 which has a first side 14 and a second side 16. The substrate 12 may be a printed circuit board which contains routing traces, power/ground planes, vias, etc. as is known in the art. One edge of the substrate 12 may include a plurality of conductive pads 18. The conductive pads 18 can be plugged into a card edge type electrical connector (not shown) which is mounted to a motherboard (not shown). The conductive pads 18 may extend along both sides 14 and 16 of the substrate 12.

The assembly 10 may include a number of first integrated circuit packages 20 that are mounted to the first side 14 of the substrate 12 and a plurality of second integrated circuit packages 22 that are mounted to the second side 16 of the substrate 12. The packages 20 and 22 may each contain an integrated circuit. By way of example, one or more of the first integrated circuit packages 20 may contain a microprocessor. One or more of the second integrated circuit packages 22 may contain a memory device. Each integrated circuit package 20 and 22 may contain a metal lid 24 that is thermally coupled to the integrated circuit of the package.

The assembly 10 may include a thermal plate 26 that is thermally coupled to the first integrated circuit packages 20. The thermal plate 26 is preferably constructed from a thermally conductive material such as aluminum or copper. The thermal plate 26 may be attached to the substrate 12 by a plurality of pins 28 that extend through corresponding substrate clearance holes 30. The thermal plate 26 may be secured to the substrate 12 by springs 32 that are attached to the pins 28.

The springs 32 provide a spring force which pushes the plate 26 into the metal lids 24 of the first integrated circuit packages 20. A thermal grease 34 may be placed between the lids 24 and the thermal plate 26 to reduce the thermal impedance between the packages 20 and the plate 26. A heat sink 36 may be mounted to the thermal plate 26. The heat sink 36 is typically constructed from a thermally conductive material such as aluminum or copper and may include a number of fins 38 which increase the surface area of the sink 36 and the heat transfer rate from the assembly 10.

The assembly 10 may include a thermal bus bar 40 that is thermally coupled to the second integrated circuit packages 22 and the thermal plate 26. A thermal grease 34 may be placed between the bus bar 40 and the lids 24 of the packages 22. Likewise, thermal grease 34 may be placed between the bus bar 40 and the thermal plate 26. Although a thermal grease 34 is shown and described, it is to be understood that the grease may be replaced by a thermal epoxy, a thermal tape, or other thermally conductive interface material.

The thermal bus bar 40 may be attached to a cover 42 that encloses the second side 16 of the substrate 12. The cover 42 is preferably constructed from a lightweight plastic material. The cover 42 may have studs 44 which extend through corresponding holes of the bus bar 40. The studs 44 may attach the bus bar 40 to the cover 42. The cover 42 may be attached to the thermal plate 26 by tabs 46 that are inserted into slots 48 of the plate 26. Attachment of the cover 42 to the plate 26 may push the bus bar 40 into the lids 24 of the second integrated circuit packages 22.

The thermal bus bar 40 is typically constructed from a thermally conductive material such as aluminum or copper. The thermal bus bar 40 provides a conductive path from the second integrated circuit packages 22 to the thermal plate 26 and the heat sink 36. Incorporating a bus bar 40 creates an electronic assembly 10 wherein heat can flow to a single heat sink 36 from integrated circuit packages 20 and 22 located on both sides 14 and 16 of a substrate 12.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic assembly, comprising:
   a substrate which has a first side and a second side;
   a first integrated circuit package mounted to said first side of said substrate, said first integrated circuit package having a top surface;
   a thermal plate coupled to said top surface of said first integrated circuit and located adjacent to said first side of said substrate;
   a second integrated circuit package mounted to said second side of said substrate, said second integrated circuit package having a top surface; and,
   a thermal bus bar coupled to said top surface of said second integrated circuit package and coupled to said thermal plate.

2. The assembly as recited in claim 1, further comprising a cover that encloses said second side of said substrate.

3. The assembly as recited in claim 1, wherein said substrate has a plurality of conductive pads located along an edge of said substrate.

4. The assembly as recited in claim 1, further comprising a thermal grease located between said thermal plate and said thermal bus bar.

5. The assembly as recited in claim 1, further comprising a thermal grease located between said thermal plate and a lid of said first integrated circuit package.

6. The assembly as recited in claim 1, wherein said thermal plate is attached to said substrate.

7. The assembly as recited in claim 1, further comprising a heat sink that is mounted to said thermal plate.

8. The assembly as recited in claim 1, wherein said first integrated circuit package contains a microprocessor and said second integrated circuit package contains a memory device.

9. The assembly as recited in claim 2, wherein said cover is attached to said thermal bus bar.

10. An electronic assembly, comprising:
    a substrate which has a first side and a second side, said substrate having a plurality of conductive pads that are located along an edge of said substrate;
    a first integrated circuit package mounted to said first side of said substrate;
    a thermal plate coupled to said first integrated circuit and located adjacent to said first side of said substrate;
    a second integrated circuit package mounted to said second side of said substrate;
    a cover located adjacent to said second side of said substrate;
    a thermal bus bar coupled to said second integrated circuit package and thermally coupled to said thermal plate; and,
    a heat sink mounted to said thermal plate.

11. The assembly as recited in claim 10, wherein said cover is attached to said thermal bus bar.

12. The assembly as recited in claim 11, further comprising a thermal grease located between said thermal plate and said thermal bus bar.

13. The assembly as recited in claim 12, further comprising a thermal grease located between said thermal plate and a lid of said first integrated circuit package.

14. The assembly as recited in claim 13, wherein said thermal plate is attached to said substrate.

15. The assembly as recited in claim 14, wherein said first integrated circuit package contains a microprocessor and said second integrated circuit package contains a memory device.

* * * * *